(12) United States Patent
Yamazaki

(10) Patent No.: US 8,901,731 B2
(45) Date of Patent: Dec. 2, 2014

(54) TERMINAL BOX

(75) Inventor: Masakazu Yamazaki, Yao (JP)

(73) Assignee: Hosiden Corporation, Osaka (JP)

( * ) Notice: Subject to any disclaimer, the term of this patent is extended or adjusted under 35 U.S.C. 154(b) by 75 days.

(21) Appl. No.: 13/568,450

(22) Filed: Aug. 7, 2012

(65) Prior Publication Data

US 2013/0193568 A1   Aug. 1, 2013

(30) Foreign Application Priority Data

Aug. 11, 2011  (JP) ................. 2011-176202

(51) Int. Cl.
| | |
|---|---|
| *H01L 23/367* | (2006.01) |
| *H01L 23/32* | (2006.01) |
| *H05K 7/00* | (2006.01) |
| *H01L 31/048* | (2014.01) |
| *H01L 23/057* | (2006.01) |

(52) U.S. Cl.
CPC .............. *H01L 23/367* (2013.01); *H01L 23/32* (2013.01); *H05K 7/005* (2013.01); *Y02E 10/50* (2013.01); *H01L 31/0485* (2013.01); *H01L 23/057* (2013.01)
USPC ...................................... 257/698

(58) Field of Classification Search
USPC ............................ 439/535, 534, 372; 257/698
See application file for complete search history.

(56) References Cited

U.S. PATENT DOCUMENTS

| | | | |
|---|---|---|---|
| 6,655,987 B2 * | 12/2003 | Higashikozono et al. | .... 439/535 |
| 6,828,503 B2 | 12/2004 | Yoshikawa et al. | |
| 2003/0183405 A1 | 10/2003 | Hoebel et al. | |
| 2005/0224110 A1 | 10/2005 | Yoshikawa et al. | |
| 2005/0287843 A1 | 12/2005 | Tsukamoto | |

FOREIGN PATENT DOCUMENTS

| | | |
|---|---|---|
| DE | 10010979 A1 | 9/2001 |
| DE | 102004001011 A1 | 9/2004 |
| EP | 1587149 A2 | 10/2005 |
| JP | 2005251962 A | 9/2005 |
| JP | 2006013018 A | 1/2006 |
| JP | 2006135246 A | 5/2006 |
| JP | 2011082210 A | 4/2011 |

* cited by examiner

*Primary Examiner* — Marc Armand
(74) *Attorney, Agent, or Firm* — The Webb Law Firm

(57) ABSTRACT

A plurality of terminal plates are arranged in a row in the interior of a box body. Neighboring terminal plates are electrically connected by a diode. The diode is provided with a first terminal part that is laid on, soldered to, and electrically connected to the first terminal plate. A slit is provided formed along the outer perimeter of a region on which the first terminal part is laid on the first terminal plate.

6 Claims, 4 Drawing Sheets

TERMINAL BOX

BACKGROUND OF THE INVENTION

1. Field of the Invention

The present invention relates to a terminal box provided with a plurality of terminal plates, which are arranged in a row within a box body, and a diode for electrically connecting the terminal plates, where the diode is provided with terminal parts that are laid on the terminal plates and electrically connected thereto by soldering.

2. Description of the Related Art

In the aforedescribed terminal box, when the terminal parts of the diode are laid on the terminal plates and soldered, the heat of the melting solder is conducted to the terminal plates, large amounts of heat are discharged, and the time required to heat the solder tends to increase. Therefore, in addition to longer periods of time required for soldering, the diode is excessively heated by the heat conducted from the terminal parts, and the performance of the diode may be impaired.

In order to prevent this situation, in a conventional terminal box, a region of the terminal plates around the location at which the terminal parts of the diode are soldered is cut out, and the conduction of heat to the terminal plates from the melting solder is minimized (see, e.g., Japanese Laid-Open Patent Application No. 2006-135246).

However, the lateral edge portions of the terminal parts are laid on the terminal plates, straddling the locations cut out from the terminal plates in such configurations. The heat of the melting solder is therefore readily conducted from the lateral edge portions of the terminal parts to the terminal plates, and the conduction of the heat of the melting solder to the terminal plates may not be minimized efficiently. Additionally, the melting solder at the locations connecting the terminal parts and the terminal plates readily flows past the lateral edge portions of the terminal parts toward the terminal plates. The amount of solder that connects the terminal parts and the terminal plates may be insufficient, and electrical and mechanical performance may be impaired.

The present invention was devised in light of the aforedescribed problems, it being an object thereof to provide a terminal box that can efficiently minimize the conduction of the heat of melting solder to the terminal plates, without impairing electrical and mechanical performance at locations connecting the terminal parts and the terminal plates.

SUMMARY OF THE INVENTION

A terminal box according to the present invention comprises a box body; a plurality of terminal plates arranged in a row in the interior of the box body; and a diode for electrically connecting the terminal plates, wherein the diode has a first terminal part, the first terminal part being laid on, soldered to, and thereby electrically connected to the first terminal plate; and the first terminal plate has a slit formed along an outer perimeter of the region on which the first terminal part is laid.

In the terminal box of the present configuration, the existence of the slit formed along the outer perimeter of the region on which the first terminal part is laid allows the conduction of the heat of the melting solder to the terminal plates to be minimized. Additionally, the occurrence of melting solder flowing out toward the terminal plate from the location connecting the first terminal part and the terminal plate can be minimized.

Therefore, if a terminal box has the present configuration, the conduction of the heat of melting solder to the terminal plates can be efficiently minimized, and the electrical and mechanical performance at locations connecting the terminal parts and the terminal plates is also unlikely to be impaired.

In a preferred embodiment of the present invention, the first terminal plate comprises a positioning piece capable of making contact with the first terminal part and thereby determining the position at which the first terminal part is laid on the first terminal plate.

In the present configuration, the first terminal part of the diode makes contact with the positioning piece, whereby the position at which the first terminal part is laid on one of the terminal plates can be simply and accurately determined.

In a preferred embodiment of the present invention, the diode comprises a body part and a second terminal part, the second terminal part being electrically connected to the second terminal plate; and the second terminal plate has an anchoring part to which the second terminal part is soldered, and a linking part for linking the anchoring part to the body part so as to allow relative displacement.

In terminal boxes that are exposed to severe environmental temperatures, such as, e.g., terminal boxes used for photovoltaic modules, the terminal plates and the diodes are subject to repeated heat deformation (thermal expansion and contraction) at different ratios, according to changes in environmental temperature. The load concentrations that result from the differences in the amount of heat deformation of the terminal plates and the diodes act repeatedly on the portions connecting the terminal plates and the diodes, and connection defects may occur. If the present configuration is used, the linking part of the second terminal plate allows the relative displacement of the second terminal plate and the diode resulting from changes in environmental temperature to be absorbed as the relative displacement of the anchoring part and the body part of the second terminal plate while maintaining the connection state between the second terminal part of the diode and the anchoring part of the second terminal plate.

Therefore, even when, e.g., changes in the temperature of the installation environment produce forces that act in different directions between the second terminal plate and the diode, the disparity between these forces can be absorbed at the linking part, and connection defects between the second terminal plate and the diode can be prevented in advance. If the terminal box has the present configuration, the load concentrations that result from differences in the amount of heat deformation of the terminal plates and the diodes is therefore impeded from acting on the portions connecting the terminal plates and the diodes, and connection defects do not readily occur.

This operational effect can also be exhibited in the same manner when any variety of diodes are attached, regardless of the difference between the format or structure of the attached diodes. Examples of the linking part include employing configurations in which the width (or the thickness, or both the width and the thickness) of the linking part is less than in the body part and anchoring part of the second terminal plate, and configurations in which the material of the linking part deforms more readily than other portions.

In a preferred embodiment of the present invention, the second terminal plate comprises a metal plate; and the linking part comprises a band-plate portion formed by being punched out of the second terminal plate along with the anchoring part.

If the present configuration is used, the labor of working and assembly can be reduced, and manufacturing costs can be lowered in comparison to cases in which the linking part is configured using members other than the second terminal plate. The shape of the band-plate portion that constitutes the linking part can be freely set. Besides linearly linking the body part and the anchoring part of the terminal plate, bent shapes, shapes resulting from combining linear and bent shapes, or other shapes may be used.

In a preferred embodiment of the present invention, the band-plate portion comprises a bent part, the bent part being bent and deformed in the direction of band thickness.

If this configuration is used, the relative displacement of the second terminal plate and the diode resulting from changes in environmental temperature can be reliably absorbed as relative displacement between the anchoring part and the body part in the direction along the surface of the terminal plate and the thickness direction of the terminal plate.

DETAILED DESCRIPTION OF THE PREFERRED EMBODIMENTS

Figure 1:
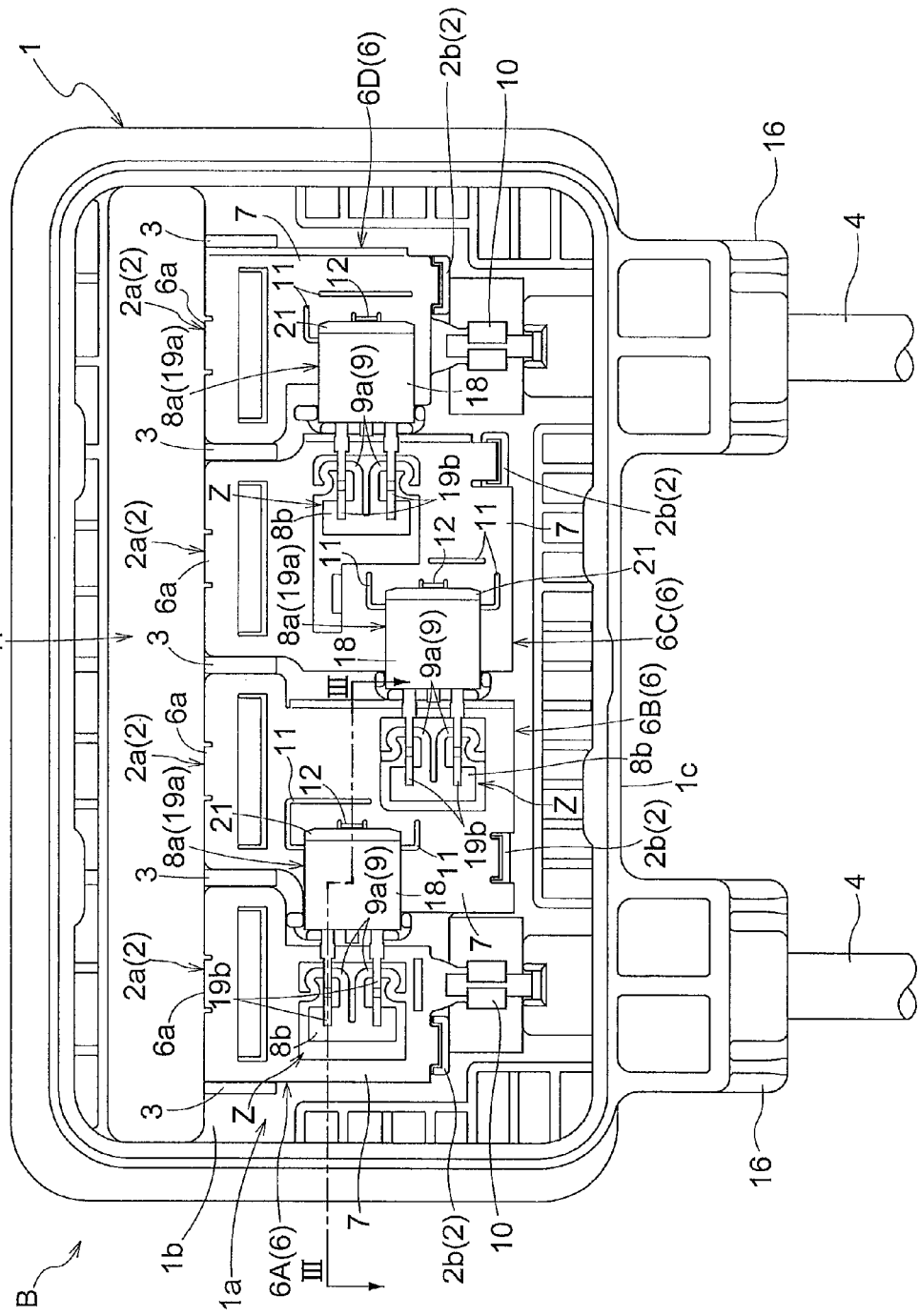
FIG. 1 is a front view that shows the interior of the terminal box.
Figure 2:
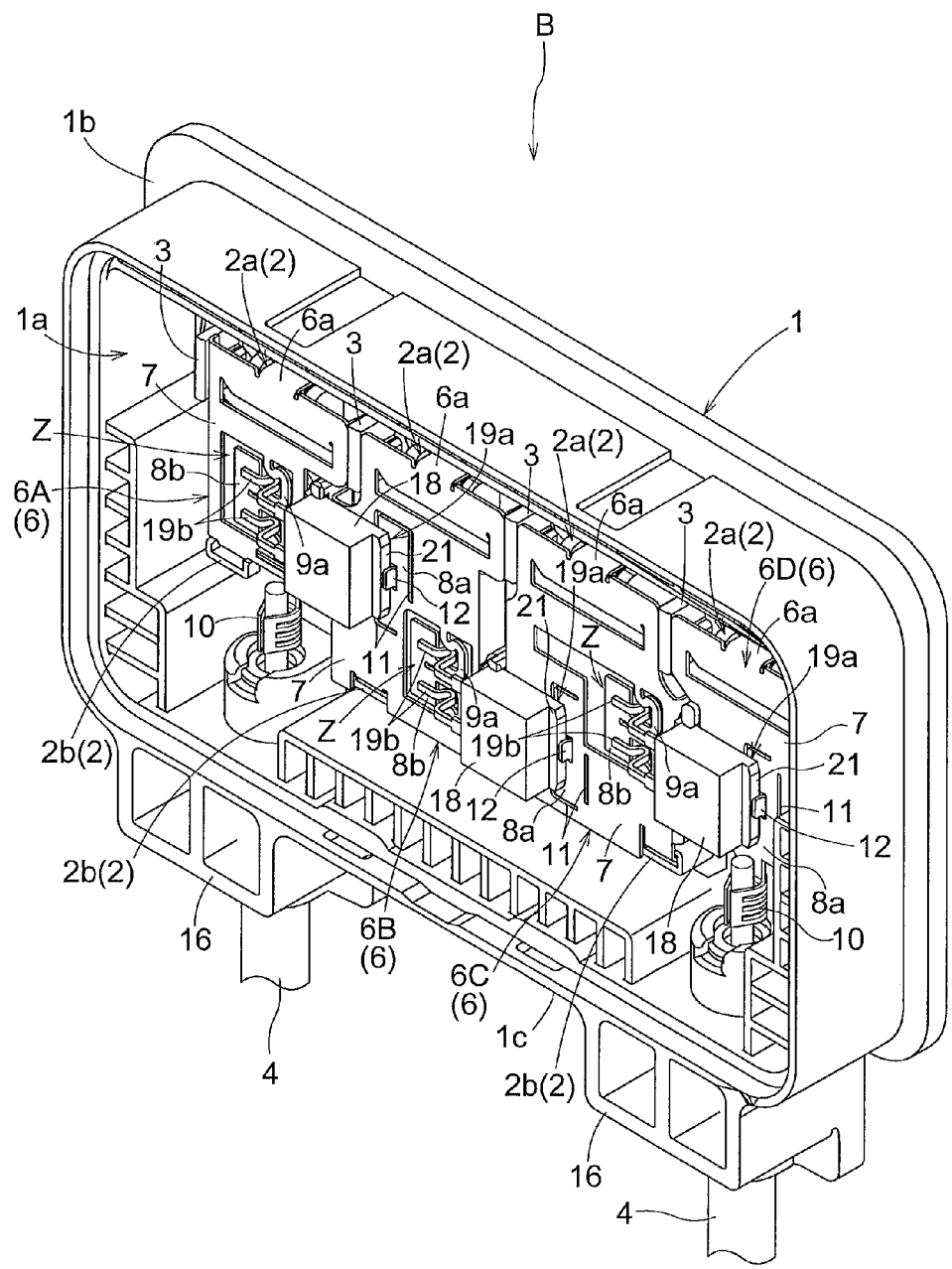
FIG. 2 is a perspective view that shows the interior of the terminal box.

Embodiments of the present invention will be described below on the basis of the drawings. FIGS. 1 and 2 show a terminal box B that is connected to a photovoltaic module. The terminal box B has an aperture part 1a, a bottom plate 1b, and lateral plates 1c, and is provided with a rectangular box-shaped box body 1, which is made of resin, and a lid (not shown), which covers the aperture part 1a of the box body 1 and is made of resin. In the interior of the box body 1, four terminal plates 6 (6A through 6D) that are electrically connected to the photovoltaic module (not shown) are arranged in a row.

Two types of holding parts 2 (2a, 2b) for latching to and holding the terminal plates 6, and a holding wall 3 for contacting and positioning the edge parts of the terminal plates 6 are provided to positions corresponding to each of the terminal plates 6. A terminal-lead-in hole 17 into which output terminals (not shown) of the photovoltaic module are led is formed through the bottom plate 1b. The output terminals are electrically connected to the terminal plates 6.

The holding part 2a is configured as a linear latching part (latching part 2a below), and the holding part 2b is configured as a channel-shaped interlocking part (interlocking part 2b below). The latching part 2a latches to and thereby holds a latch part 6a formed on a first lateral strip part of the terminal plates 6. The interlocking part 2b interlocks with a second lateral strip part of the terminal plates 6.

A pair of cable-passing parts 16 are formed on the lateral plate 1c of the box body 1. A pair of output cables 4 for connecting the terminal plates 6 to a storage battery or the like are passed separately through the cable-passing parts 16 in a state such that water-proofing is maintained.

Each of the terminal plates 6 is formed by sheet-metal working electrically conductive metal plates. These terminal plates 6 are held by the holding parts 2 and the holding wall 3, whereby the plates are arranged in a row so that neighboring plates are separated and insulated from each other. The neighboring terminal plates 6 are electrically connected through a bypass diode 18 (referred to hereinafter simply as the diode 18).

Figure 3:
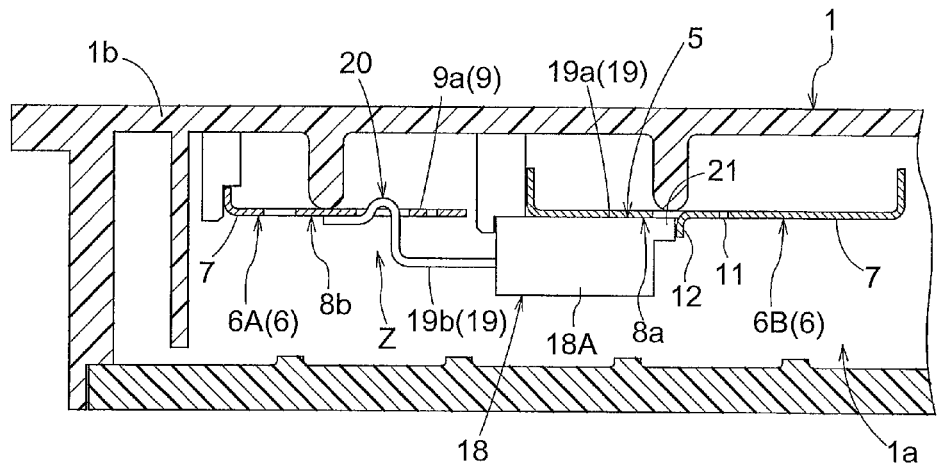
FIG. 3 is a cross-sectional view that shows the primary parts of the terminal plates and the diode when attached.
Figure 4:
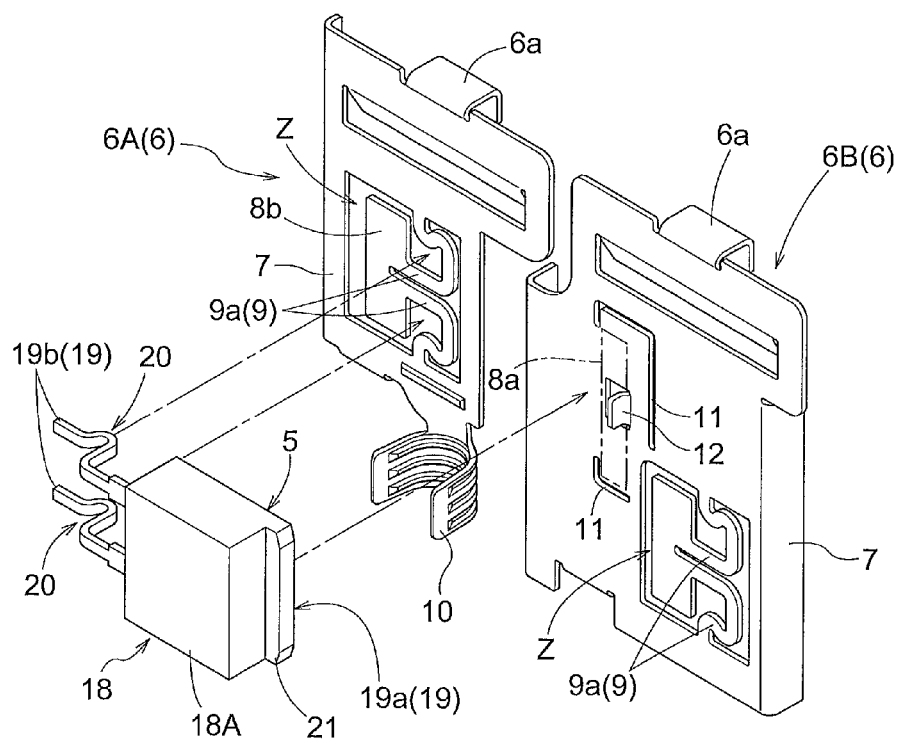
FIG. 4 is an exploded perspective view that shows the primary parts of the terminal plates and the diode when attached.
Figure 5:
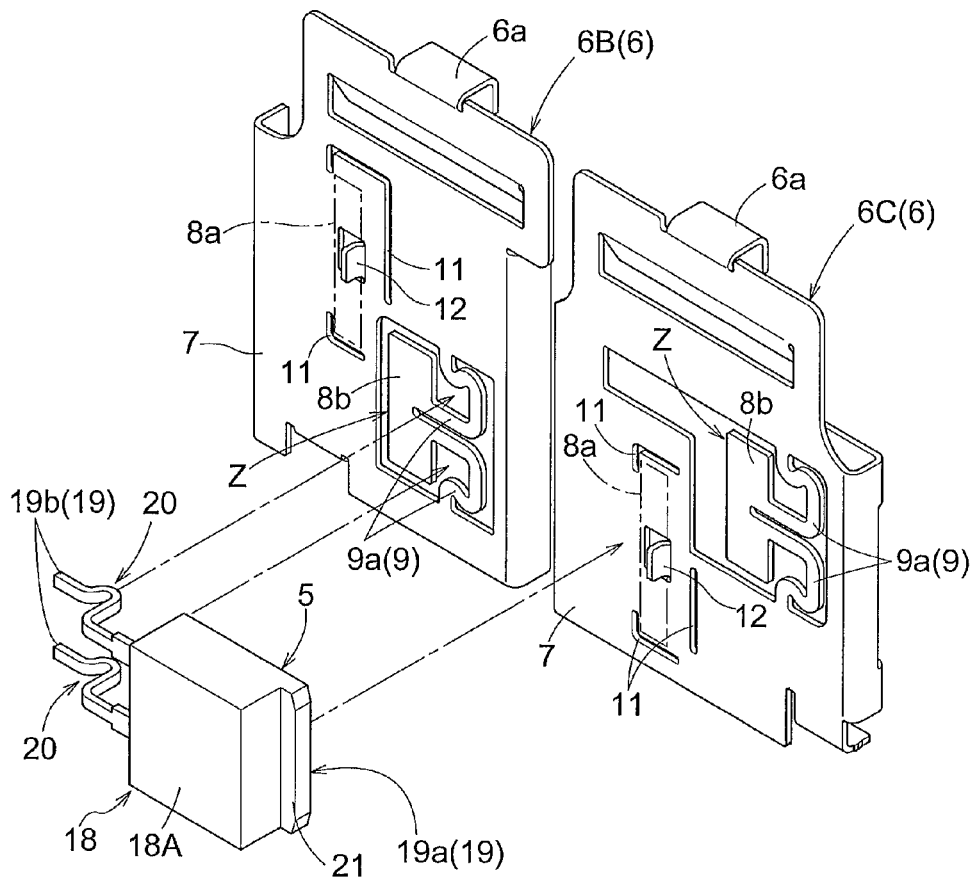
FIG. 5 is an exploded perspective view that shows the primary parts of the terminal plates and the diode when attached.

FIGS. 3 and 4 show the structure for connecting the neighboring terminal plates 6A, 6B and the diode 18 on the left end in FIG. 1. FIG. 5 shows the structure for connecting the neighboring terminal plates 6B, 6C and the diode 18 in the center in FIG. 1. Also, the structure for connecting the neighboring terminal plates 6C, 6D and the diode 18 on the right end in FIG. 1 is identical to the structure for connecting the terminal plates 6A, 6B and the diode 18, and a description thereof is therefore omitted.

As shown in FIGS. 3 through 5, the diode 18 is configured as a packaged diode integrally formed from a diode body 18A, which is integrally formed in the shape of a rectangular block plate, and a lead terminal part 19.

The lead terminal part 19 is configured from a pair of anodes 19b, which protrude at right angles from a first end surface of the diode body 18A, and a cathode 19a, which is integrally formed along a second surface of the diode body 18A facing the first end surface.

In the present embodiment, the cathode 19a corresponds to the first terminal part. Additionally, in the combination of the terminal plates 6A, 6B shown in FIGS. 3 and 4, the terminal plate 6B corresponds to the first terminal plate, and in the combination of the terminal plates 6B, 6C shown in FIG. 5, the terminal plate 6C corresponds to the first terminal plate.

In the present embodiment, the pair of the anodes 19b corresponds to the second terminal part. Additionally, in the combination of the terminal plates 6A, 6B shown in FIGS. 3 and 4, the terminal plate 6A corresponds to the second terminal plate, and in the combination of the terminal plates 6B, 6C shown in FIG. 5, the terminal plate 6B corresponds to the second terminal plate.

The cathode 19a (the first terminal part) is configured from a rectangular metal plate and is integrally provided to a part on a back surface portion of the diode body 18A. An edge part of the cathode 19a is configured as a protruding edge part 21 that protrudes slightly further than the second end surface of the diode body 18A.

The surface facing toward the first terminal plate 6 (the terminal plate 6B in FIGS. 3 and 4, the terminal plate 6C in FIG. 5) of the protruding edge part 21 functions as a surface-mounted connecting surface 5 that is electrically connected to the first terminal plate 6. The connecting surface 5 is laid on a connecting region 8a set on the first terminal plate 6 and is soldered by hand or machine using a soldering iron and thereby electrically connected.

Slits 11 are formed discontinuously cut out from the terminal plate 6 along the outer perimeter of the connecting region 8a, which is connected to the connecting surface 5, on the first terminal plate 6 (the terminal plate 6B in FIGS. 3 and 4, the terminal plate 6C in FIG. 5), i.e., the region on which the cathode 19a (the first terminal part) is laid. The slits 11 are therefore disposed so as to discontinuously enclose the connecting region 8a. A positioning piece 12 is formed cut out on the first terminal plate 6 at a site closer to the connecting region 8a than the slits 11. The positioning piece 12 and the cathode 19a make contact, whereby the position of the connecting surface 5 relative to the connecting region 8a, i.e., the position at which the cathode 19a is laid on the first terminal plate 6, can be determined.

As shown in FIG. 4, the pair of the anodes 19b are configured using metal band plates and are arranged in a row so as to be separated by a gap in the width direction. Distal end parts of the anodes 19b (the second terminal part) in the longitudinal direction are anchored by soldering to an anchoring part 8b present on the second terminal plate 6 (the terminal plate 6A in FIGS. 3 and 4, the terminal plate 6B in FIG. 5).

The center parts of the anodes 19b in the longitudinal direction are formed so that the lengthwise cross-sections have a J-shape. Providing such formed parts 20 allows changes in relative position between the distal end parts and the basal end parts of the anodes 19b to be readily absorbed by flexural deformation.

The four row-arranged terminal plates 6 (6A through 6D) have a terminal-plate-body part 7 that is configured to have a substantially rectangular shape. The anchoring part 8b, to which the anodes 19b (the second terminal part) are soldered, and a linking part 9, which links the terminal-plate-body part 7 and the anchoring part 8b so as to allow relative displacement, are formed on the terminal plates 6A, 6B, 6C. The connecting region 8a, to which the cathode 19a (first terminal part) of the diode 18 is soldered, is formed on the terminal plates 6B, 6C, 6D. The connecting region 8a is formed as a portion of the terminal-plate-body part 7.

Among the four row-arranged terminal plates 6, the terminal plate 6A and the terminal plate 6D that are positioned on either end part in the row-arrangement direction are provided with a clip connector 10 for electrically connecting the output cables 4. The interlocking part 2b interlocks with the terminal plate 6B and the terminal plate 6C that are positioned in the central part in the row-arrangement direction.

Therefore, as shown in FIGS. 1 and 2, the terminal plate 6A and the terminal plate 6D are held at the edge parts thereof on both sides by the holding wall 3 of the box body 1, and are disposed in a state such that the latch part 6a on the first of the lateral strip parts is latched to the latching part 2a of the box body 1. The end parts of the output cables 4 that pass through the cable-passing parts 16 of the box body 1 are securely clipped, and thereby electrically connected, to the clip connector 10

The terminal plate 6B and the terminal plate 6C are held at the edge parts thereof on both sides by the holding wall 3 of the box body 1, interlocked with the interlocking part 2b of the 1, and disposed in a state such that the latch part 6a is latched to the latching part 2a of the box body 1.

The anchoring part 8b and the linking part 9 of the terminal plates 6 will now be described. As shown in FIGS. 4 and 5, a part of the terminal plate 6 is punched out, whereby the anchoring part 8b and the linking part 9 are formed at the site enclosed by a punched-out zone Z.

In the present embodiment, the anchoring part 8b is configured in the punched-out zone Z by a rectangular portion that is formed in a state separated from the terminal-plate-body part 7. The linking part 9 is configured using a pair of band-plate portions 9a formed by being punched out from the terminal plate 6 together with the anchoring part 8b.

The pair of the band-plate portions 9a are formed having a thin-width bent shape that is integrally provided from a part of a longitudinal strip portion of the rectangular anchoring part 8b over an internal-perimeter edge part facing the punched-out zone Z of the terminal-plate-body part 7. The bent shape is set to have a J-shape (or a laterally inverted J-shape) when viewed from above.

In cases where, e.g., changes in temperature or other factors cause stress between the neighboring terminal plates 6, between the diodes 18 and the terminal plates 6, between the box body 1 and the terminal plates 6, or at other locations, and that stress acts on the portions connecting the anodes 19b and the anchoring parts 8b, providing the linking part 9 allows for the linking part 9 to bend, deform, and absorb the stress, whereby concentrations of stress can be mitigated. The linking part 9 is thus configured using a band-plate portion that is thinner than the anchoring part 8b and the terminal-plate-body part 7. The linking part 9 has a small cross-sectional area and can therefore permit deformation earlier than other portions.

The linking part 9 is provided according to the terminal box B of the present embodiment, whereby mutual displacement of the diode 18 and the terminal-plate-body part 7 is permitted while maintaining the connected state. Even when, e.g., forces between the diode 18 and the terminal plates 6 act in different directions due to temperature changes in the installation environment, the force can be absorbed at the linking part 9, and connection defects between the diode 18 and the terminal plates 6 can be prevented in advance. Connection defects therefore do not readily occur, even in cases where the terminal box B is connected to a device, such as a photovoltaic module, that is installed in an environment subject to extreme changes in temperature. A configuration is employed for the linking part 9 such that the width of the member is less than other parts, and therefore significant labor for working is not needed, and lower costs can be provided.

(Other Embodiments)

(1) The slits 11 of the terminal plates 6 may also be formed continuously along the outer perimeter of the region 8a on which the first terminal part is laid.

(2) The slits 11 of the terminal plates 6 may also be formed at positions bordering the region 8a along the outer perimeter of the region 8a on which the first terminal part is laid, even when the slits are provided separated by a gap from the region 8a.

(3) The diode 18 may also be provided with two of the first terminal parts 19a, and the slits 11 may also be formed in the terminal plates 6 along the respective outer perimeters of the regions on which the first terminal parts 19a are laid.

(4) The terminal plates 6 and the terminal parts (19a, 19b) may be electrically connected by reflow soldering instead of soldering by hand or by machine using a soldering iron.

(5) The shape, structure, and number of the terminal plates 6 are not limited to those described in the previous embodiment, and appropriate modifications are possible.

(6) The band-plate portions 9a of the linking part 9 are not limited to those described in the previous embodiment, and the band-plate portions 9a may also have linear, arcuate, or other shapes. Instead of a structure in which the band width is less than other parts, a configuration in which the thickness and the cross-sectional area are made smaller than in other parts may also be used. Additionally, a configuration in which the material of the linking part 9 itself deforms more readily than other parts may also be used.

Figure 6:
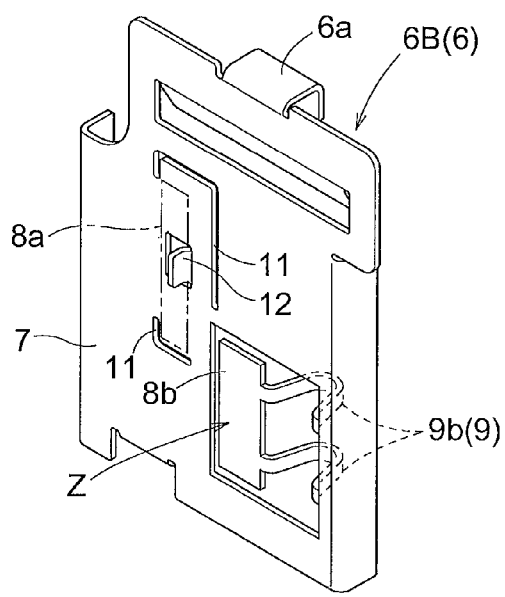
FIG. 6 is a perspective view that shows the linking part of another embodiment.

(7) A configuration in which the band-plate portions 9a of the linking part 9 have, e.g., bent parts 9b that are bent and deformed in the direction of band thickness may also be used, as shown in FIG. 6. In such instances, the bent parts 9b allow the band-plate portions 9a to be readily displaced, even in the thickness direction of the terminal plates. Displacement of the anchoring part 8b and the terminal-plate-body part 7 can thereby be reliably absorbed as relative displacement in the direction along the plate surface of the terminal plates 6 and in the thickness direction of the terminal plates.

(8) The terminal box B according to the present invention may also be connected to other types of connection targets besides photovoltaic modules.

What is claimed is:
1. A terminal box, comprising:
a box body;

a plurality of terminal plates arranged in a row in the interior of the box body wherein edges of adjacent terminal plates are in facing relationship to one another and spaced from one another to electrically isolate the plates from one another; and a diode for electrically connecting the terminal plates, wherein the diode has a first terminal part, the first terminal part being laid on, soldered to, and thereby electrically connected to a first terminal plate; and the first terminal plate has a discontinuous slit formed along an outer boundary of a region on which the first terminal part is electrically connected to the first terminal plate.

2. The terminal box according to claim 1, wherein the first terminal plate comprises a positioning piece capable of making contact with the first terminal part and thereby determining the position at which the first terminal part is laid on the first terminal plate.

3. The terminal box according to claim 1, wherein the diode comprises a body part and a second terminal part, the second terminal part being electrically connected to a second terminal plate; and the second terminal plate has an anchoring part to which the second terminal part is soldered, and a linking part for linking the anchoring part to the body part so as to allow relative displacement.

4. The terminal box according to claim 1, wherein the diode comprises a body part and a second terminal part opposite to the first terminal part, the second terminal part having a first part of an anchoring arrangement; and the second terminal plate having a second part of the anchoring arrangement, wherein the second part of the anchoring arrangement is a cut out having an engaging member within the cut out to receive the first part of the anchoring arrangement, wherein the first part and the second part of the anchoring arrangement are joined together to link the second terminal plate to the second terminal part of the diode so as to allow relative displacement between the diode and the second terminal plate, and the second terminal part of the diode is soldered to the second terminal plate to electrically connect the diode to the second terminal plate.

5. The terminal box according to claim 3, wherein the second terminal plate comprises a metal plate; and the linking part comprises a band-plate portion formed by being punched out of the second terminal plate along with the anchoring part.

6. The terminal box according to claim 5, wherein the band-plate portion comprises a bent part, the bent part being bent and deformed in the direction of band thickness.

* * * * *